United States Patent [19]

Buiguez et al.

[11] Patent Number: 4,636,281
[45] Date of Patent: Jan. 13, 1987

[54] PROCESS FOR THE AUTOPOSITIONING OF A LOCAL FIELD OXIDE WITH RESPECT TO AN INSULATING TRENCH

[75] Inventors: François Buiguez, Saint Egieve; Joël Hartmann, Claix, both of France

[73] Assignee: Commissariat a l'Energie Atomique, Paris, France

[21] Appl. No.: 744,339

[22] Filed: Jun. 13, 1985

[30] Foreign Application Priority Data

Jun. 14, 1984 [FR] France ................................ 84 09315

[51] Int. Cl.$^4$ ...................... H01L 21/306; B44C 1/22; C03C 15/00; C03C 25/06
[52] U.S. Cl. ............................ 156/643; 148/DIG. 50; 29/576 W; 29/580; 156/646; 156/648; 156/651; 156/653; 156/657; 156/661.1; 156/662; 357/47; 357/59; 427/93
[58] Field of Search .............. 29/576 W, 580; 357/47, 357/49, 58; 427/93, 94; 156/643, 646, 648, 651, 653, 657, 659.1, 661.1, 662; 148/DIG. 50; 204/192 E

[56] References Cited

U.S. PATENT DOCUMENTS 4,472,240  9/1984  Kameyama ........................ 156/648
4,477,310 10/1984  Park et al. ........................ 156/653 X
4,534,824  8/1985  Chen ................................ 156/648 X

FOREIGN PATENT DOCUMENTS 0090111  5/1983  European Pat. Off. .
0091507 10/1983  European Pat. Off. .
0096596 12/1983  European Pat. Off. .
0108624  5/1984  European Pat. Off. .

OTHER PUBLICATIONS

IBM Technical Disclosure Bulletin, vol. 24, Nos. 7B, 7A, Dec. 1981, vol. 20, No. 1, Jun. 1977.

Primary Examiner—William A. Powell
Attorney, Agent, or Firm—Oblon, Fisher, Spivak, McClelland & Maier

[57] ABSTRACT

Process for the autopositioning of a local field oxide relative to an insulating trench.

This process consists of forming at least one first insulating coating on a silicon substrate, producing a second insulating coating on the first coating, anisotropically etching the first and second coating until the region of the substrate in which the trench is to be formed is exposed, forming insulating spacers on the etched flanks of the first and second coatings, anisotropically etching the substrate region in order to form the trench, the second etched coating and the spacers used as a mask for said etching, eliminating the mask, forming the insulating edges in the trench, filling said trench with a material and forming the field oxide.

17 Claims, 13 Drawing Figures

PROCESS FOR THE AUTOPOSITIONING OF A LOCAL FIELD OXIDE WITH RESPECT TO AN INSULATING TRENCH

BACKGROUND OF THE INVENTION

The present invention relates to a process for the autopositioning of a local field oxide with respect to an insulating trench.

This process can be used in the field of microelectronics, whenever it is necessary to insulate from one another the components of a circuit (transistors, diodes, etc.), produced on a semiconductor support. Thus, it more particularly applies to integrated circuits using silicon as the substrate, such as bipolar, CMOS, or MOS integrated circuits.

Attempts to achieve a high integration density in this type of circuit and more particularly in the case of CMOS integrated circuits calls for a special insulating procedure between the different components of these circuits, and particularly between type N and type P transistors, when it is wished to reduce the distance between these complementary transistors.

One of the recent insulating procedures used with this aim in mind is based on the formation of an insulating trench in a semiconductor substrate, surmounted by a local field oxide. FIGS. 1 and 2 show the different stages of such an insulating procedure.

The first stage thereof, as shown in FIG. 1, consists of depositing on a monocrystalline silicon substrate 2 a silicon oxide coating 4 having a thickness of approximately 1 micron. After producing a resin mask 6, the oxide coating 4 is anisotropically etched until a region of the substrate in which the trench will be formed is exposed. The use of anisotropic etching means that the oxide coating 4 only has to be etched in a single direction in space.

Following the elimination of the mask 6, trenches 8 are opened in substrate 2 by etching several microns of the substrate, e.g. 5 μm, with the aid of anisotropic etching. This is followed by the chemical elimination of the oxide coating 4. The thus formed trench 8 is then the thermally oxidized so that it has, as shown in FIG. 2, insulating edges 10 and is then filled with a material 12 such as polycrystalline silicon.

This filling takes place by the deposition of material 12, generally using a vapour phase chemical deposition process, followed by the removal of the excess thereof located outside trench 8. The local field oxide can then be formed on the thus obtained insulating trench.

For this purpose, substrate 2 and the silicon material 12 are firstly thermally oxidized in order to obtain a silicon oxide film 14 with a thickness of 200 to 500 Å, which is followed by the deposition of a silicon nitride coating 16, particularly by a vapour phase chemical deposition process. Then, after positioning a not shown mask on nitride coating 16 with respect to the insulating trench 8, dry or wet chemical etching of the nitride coating takes place. This is followed by thick thermal oxidation in the regions where the nitride coating 16 has been etched. This procedure consisting of forming a field oxide by local oxidation from generally silicon nitride patterns is known as LOCOS technology. After forming the field oxide, the nitride coating 16 is eliminated, e.g. chemically.

This process makes it possible to obtain a good insulation in depth, as well as a good surface insulation, particularly between type N MOS transistors and type P CMOS circuits. However, this process limits the integration density of the integrated circuits using said insulating procedure. This limitation is mainly due to the fact that the local field oxide is not autopositioned or altoaligned with respect to the corresponding insulating trench.

SUMMARY OF THE INVENTION

The present invention relates to a process making it possible to autoposition a local field oxide with respect to an insulating trench and therefore to increase the integration density of the integrated circuits using such a process.

More specifically, the present invention relates to a process for the autopositioning of a local field oxide with respect to an insulating trench with a silicon substrate, wherein it comprises the following successive stages:

(a) forming at least one first insulating material coating on the substrate surface;
(b) forming a second insulating material coating on said first coating;
(c) anisotropically etching the first and second insulating material coatings until the region of the substrate in which the trench is to be formed is exposed;
(d) formation of insulating spacers on the etched flanks of the first and second insulating material coatings;
(e) anisotropically etching said region of the substrate in order to produce the trench, the second etched insulating material coating and the spacers acting as a mask for said etching;
(f) elimination of the second etched insulating material coating and the spacers;
(g) formation of insulating edges in the trench;
(h) filling the trench with a filling material, and
(i) producing the local field oxide.

In this process, the formation of insulating spacers makes it possible to define the true dimensions of the trench to be produced. It contributes greatly to obtaining an autopositioning of the local field oxide with respect to the insulating trench.

Advantageously, between stages (b) and (c) a resin mask is produced on the second insulating material coating, in order to accurately define the location of the trench. This resin mask has the property of having an opening, whose width is greater than that of the trench to be produced. The production of such a mask makes it possible to aid the autopositioning of the local field oxide with respect to the insulating trench.

The autopositioning process according to the invention can be advantageously used for a completely buried field oxide. According to the invention, for such a field oxide it is either possible to carry out slight anisotropic etching of the exposed substrate region through the resin mask between stages (c) and (d), or to carry out isotropic etching of the same substrate region between stages (d) and (e), the second etched insulating material coating and the spacers acting as a mask for said etching.

Moreover, the filling material can undergo planaing on the surface of the trench using a dry etching procedure, which may or may not be associated with a so-called "planarisation" technique, so as to only leave behind filling material within the trench.

According to a preferred embodiment of the process according to the invention, the insulating spacers are produced by depositing a third insulating material coating, particularly of silicon oxide, on the second etched insulating material coating, e.g. of silicon oxide, followed by the anisotropic etching of said third coating.

According to a preferred embodiment of the process according to the invention, a silicon oxide coating is produced on the substrate surface, e.g. by thermal oxidation of said substrate, followed by a silicon nitride coating on the oxide coating, e.g. by deposition.

According to a preferred embodiment of the process according to the invention, the material used for filling the substrate is of polycrystalline silicon. In this embodiment, the field oxide can advantageously be obtained by thermal oxidation of the polycrystalline silicon.

BRIEF DESCRIPTION OF THE DRAWINGS

The invention is described in greater detail hereinafter relative to non-limitative embodiment and the attached drawings, wherein show.

DETAILED DESCRIPTION OF THE PREFERRED EMBODIMENTS

Figure 1:
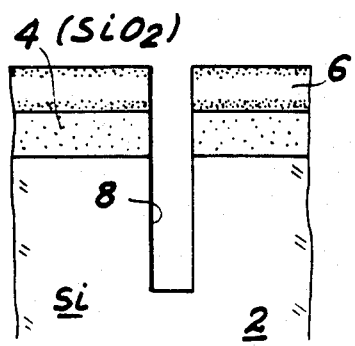
FIGS. 1 and 2 already described, diagrammatically and in longitudinal section, the different stages of a prior art process for producing a field oxide on an insulating trench.
Figure 2:
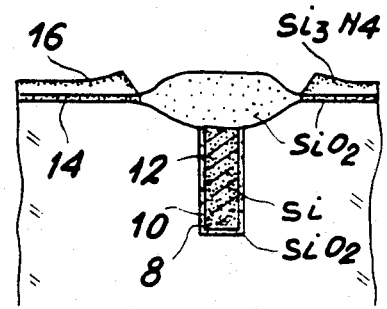
Figure 3:
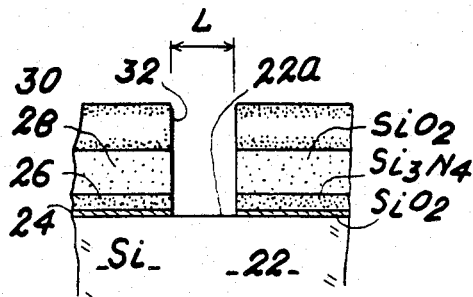
FIGS. 3 to 7 diagrammatically, and in longitudinal section the different stages of the process according to a first variant.

With reference to FIG. 3, the first stage of the process according to the invention consists of producing an insulating material coating 24, preferably of silicon dioxide ($SiO_2$), on a monocrystalline silicon substrate 22. This coating 24 can in particular be obtained by the thermal oxidation of the silicon substrate 22 at a temperature of 900° C. Coating 24 has a thickness between 100 and 500 Å.

On said silicon dioxide fil, 24 is formed another insulating coating 26, preferably of silicon nitride ($Si_3N_4$). This silicon nitride coating 26 with a thickness of approximately 800 Å can be obtained by deposition, e.g. of the vapour phase chemical deposition type (CVD or LPCVD). This nitride coating 26 will be used for the location of the field oxide to be formed.

Another insulating coating 28, preferably of silicon oxide is then formed on coating 26. Oxide coating 28, which has a thickness of approximately 1 μm, can be obtained by deposition, particularly by vapour phase chemical deposition (CVD or LPCVD). This etched insulating coating will act as a mask during the etching of the trench.

As shown in FIG. 3, this is followed by an anisotropic etching of the insulating coatings 24, 26, 28, i.e. in a single direction in space, until bringing about the exposure of the substrate region 22a in which the insulating trench will subsequently be formed. This etching can be carried out by using a resin mask 20 placed on the silicon oxide coating 28.

Figure 5:
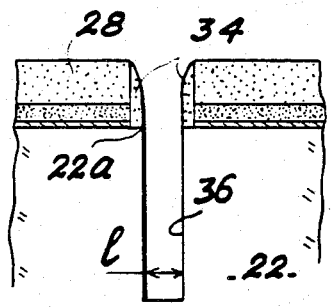

Mask 30, produced by conventional photolithography processes, makes it possible to define the location of the insulating trench to be produced. It advantageously has an opening 32, whose width L is greater than the width 1 of the trench to be produced (FIG. 5). The dimensioning of opening 32 will permit the autopositioning or autoalignment of the field oxide with respect to the insulating trench to be formed.

Anisotropic etching of the insulating coatings 24, 26, 28 can be carried out by a reactive ionic dry etching technique using trifluoremethane ($CHF_3$) as the etching agent, when the coatings are respectively formed from silicon oxide, dioxide, silicon nitride and silicon oxide or dioxide.

Figure 4:
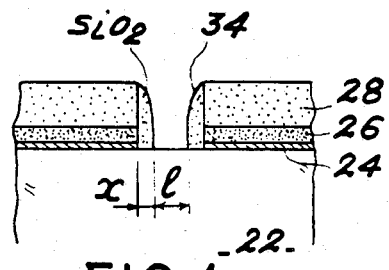

After eliminating mask 30, e.g. by plasma etching with oxygen, or chemical etching with nitric acid, as shown in FIG. 4, insulating spacers 34 are formed on the etched flanks of insulating coatings 24, 26, 28. These preferably silicon oxide spacers 34 make it possible to define the real dimensions, i.e. the width 1 of the subsequently produced insulating trench.

Spacers 34 can be formed e.g. by depositing a silicon oxide coating on coating 28, having a thickness between 3000 and 5000 Å, followed by the dry anisotropic etching of the oxide coating, e.g. by reactive ionic etching using trifluoremethane ($CHF_3$), as the etching agent. Anisotropic etching of the silicon oxide coating makes it possible to obtain spacers 34, whose width X is defined by the thickness of the oxide coating.

Width X, defining the distance separating the flanks of the trench from the active zones of the components and particularly drains of N or P transistors of CMOS circuits is determined so as to prevent any parasitic conduction on the flanks of the trench.

The following stage of the process, as shown in FIG. 5, consists of anisotropically etching substrate region 22a which has been exposed in order to produce a trench 36, having a width 1 of approximately 1 μm, and a depth of approximately 5 μm. This etching can be carried out by a reactive ionic etching process using carbon tetrachloride ($CCl_4$) or sulphur hexafluoride ($SF_6$) as the etching agent. The etched silicon oxide coating 28 and the insulating spacers 34 are used as a mask for said etching of the substrate.

Figure 6:
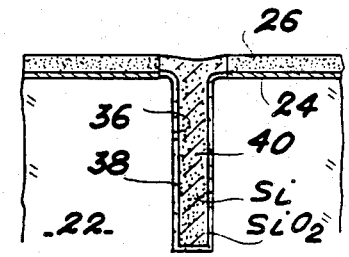

As shown in FIG. 6, this is followed by the elimination of the etched silicon oxide coating 28 and the insulating spacers 34, e.g. by a reactive ionic dry etching process using trifluoromethane ($CHF_3$) as the etching agent or by wet etching with a mixture of hydrofluoric acid (HF) and ammonium fluoride ($FNH_4$) as the etching agent. After this, the trench 36 is filled in the conventional manner.

As shown in FIG. 6, the filling firstly consists of thermally oxidizing the etched substrate 22, e.g. at a temperature of 1000° C. This oxidation makes it possible to obtain an oxide film 38 with a thickness of approximately 1000 Å on all the edges of trench 36. The latter is then filled with a material 40, which is preferably polycrystalline silicon. This filling can be carried out by isotropic deposition and particularly by vapour phase chemical deposition (CVD or LPCVD) so as to completely fill the trench.

Following this filling of trench 36, the excess material 40 which may be located outside the trench 36 is eliminated, so as to only leave material 40 within trench 36 (FIG. 6). This elimination can e.g. be carried out by reactive ionic dry etching using sulphur hexafluoride as the etching agent.

This elimination can also be carried out by a so-called planarisation technique, consisting of depositing on material coating 40 a photosensitive resin coating, which is then etched at the same speed as material 40, so as to flatten the topography above trench 36. This etching is carried out by a dry etching procedure of the reactive ionic type using a mixture of $SF_6$ and $O_2$ as the etching agent.

Figure 7:
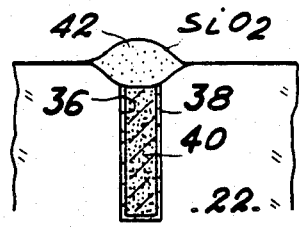

In the manner shown in FIG. 7, this is followed by the formation of the local field oxide 42, particularly by the thermal oxidation of the polycrystalline 40 filling trench 36, the patterns formed in nitride coating 36 being used for the location of said field oxide. The thickness of the field oxide is approximately 5000 Å.

It is then possible to eliminate the oxide coating 24 and the nitride coating 26, e.g. by chemical etching using orthophosphoric acid ($H_3PO_4$) for coating 26 and a $FH/FNH_4$ mixture for coating 24.

According to the invention, the LOCOS-type field oxide 42 is autopositioned relative to insulating trench 36 through the use of insulating spacers 34, as well as the use of a resin mask 30 having an opening 32, whose width L is greater than that 1 of the trench 36 formed.

The previously described process permits an autopositioning of a LOCOS-type local field oxide, e.g. partly buried relative to the insulating trench. However, it is also applicable to a buried local field oxide or recessed oxide.

Figure 8:
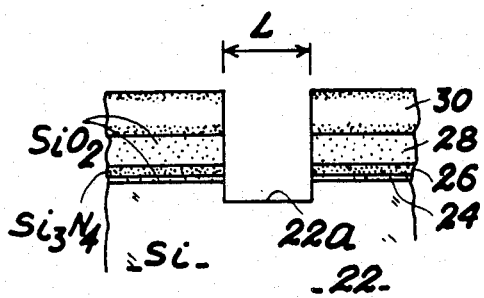
FIGS. 8 to 11 diagrammatically and in longitudinal section, the different stages of a second variant of the process according to the invention, FIGS. 12 and 13 diagrammatically and in longitudinal section, the different stages of a third variant of the process according to the invention.
Figure 9:
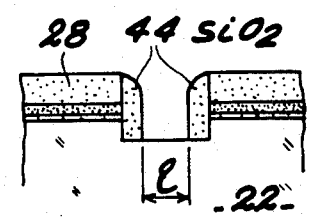
Figure 10:
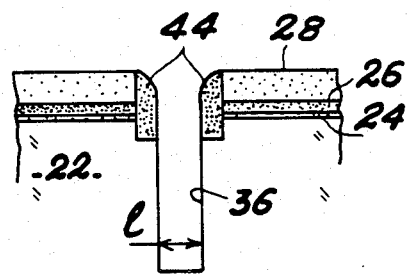

According to a first variant shown in FIGS. 8 to 11, as hereinbefore, the stack of insulating coatings 24, 26, 28 is formed, followed by the anisotropic etching of said coatings using a resin mask 30, whose opening still has a greater width L than that 1 of the trench to be formed (FIG. 10). Then, as shown in FIG. 8, substrate region 22a exposed over a depth of a few thousand Å (e.g. 2000 Å) is anisotropically etched through mask 30. This etching can e.g. be performed with sulphur hexafluoride ($SF_6$), or carbon tetrachloride ($CCl_4$).

Following this anisotropic etching and the elimination of mask 30, in the manner shown in FIG. 9, insulating spacers 44, particularly of silicon oxide are formed on the etched flanks of insulating coatings 24, 26, 28, as well as on the flanks of the etched substrate 20. As hereinbefore, spacers define the true width 1 of the trench to be formed.

Figure 11:
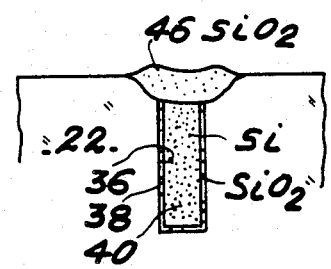

As hereinbefore, this is followed by an anisotropic etching of the substrate region 22a, in order to form trench 36, in the manner shown in FIG. 10, the etched silicon oxide coating 28 and the spacers 44 used as a mask for said etching. Following elimination of the mask, formation of the insulating edges 38 and filling the trench 36 with polycrystalline silicon 40, the latter is thermally oxidized in order to obtain a local field oxide 46. As shown in FIG. 11, this field oxide 46 is completely buried in substrate 22. It is then possible to eliminate oxide coating 24 and nitride coating 26.

Figure 12:
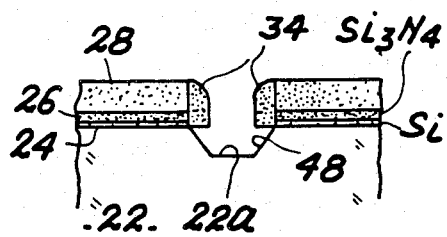
Figure 13:
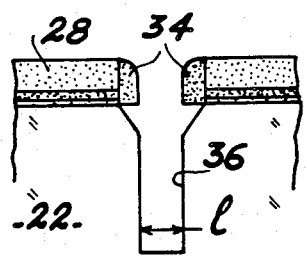

In another variant, in FIGS. 12 and 13, insulating coatings 24, 26, 28 are stacked as hereinbefore, as is their anisotropic etching and the elimination of the resin mask used for this etching. The insulating spacers 34 are then formed as hereinbefore in the case of a partly buried local field oxide. Following the formation of spacers 34, as shown in FIG. 12, there is a slight isotropic etching of the exposed substrate region 22a, i.e. etching according to three directions in space. This isotropic etching of the substrate makes it possible to obtain an inclined profile 48 of the etched flank of said substrate. It can e.g. be produced by chemical etching with potassium hydroxide (KOH) or by means of sloping plasma etching using sulphur hexafluoride or carbon tetrachloride as the etching agent. This isotropic etching is carried out by using the etched silicon oxide coating 28 and the insulating spacers 34 as the mask.

This is followed, as hereinbefore and using the same mask, by anisotropic etching of substrate region 22a, in order to form, as shown in FIG. 13, the insulating trench 36. Following the elimination of the mask, formation of the insulating edges and the filling of the trench, as hereinbefore with polycrystalline silicon, the latter is thermally oxidized, leading the obtaining of a local field oxide completely buried in the substrate.

As hereinbefore, the autopositioning of a local field oxide completely buried in the substrate with respect to an insulating trench is brought about by using insulating spacers 44 and 34 and the use of a resin mask 30 having an opening, whose width is greater than that of the insulating trench to be formed.

The process according to the invention for the autopositioning or autoalignment of a local field oxide relative to the insulating trench makes it possible to significantly increase the integration density of the integrated circuits, particularly of the bipolar or CMOS types, using such a process for electrically insulating from one another the components of these circuits.

What is claimed is:

1. A process for self-positioning a local field oxide with respect to an insulating trench formed in a silicon substrate, comprising the successive steps of:
   (a) forming at least one first insulating material coating on the substrate surface;
   (b) forming a second insulating material coating on said first coating;
   (c) anisotropically etching the first and second insulating material coatings until the region of the substrate in which the trench is to be formed is exposed;
   (d) forming insulating spacers on the etched flanks of the first and second insulating material coatings;
   (e) anisotropically said region of the substrate in order to produce the trench, the second etched insulating material coating and the spacers acting as a mask for said etching;
   (f) eliminating the second etched insulating material coating and the spacers;
   (g) forming insulating edges in the trench;
   (h) filling the trench with a polycrystalline silicon;
   (i) producing the local field oxide with a thermal oxidation of said polycrystalline silicon, the first etched insulating material coating acting as a mask for said thermal oxidation; and
   (j) eliminating the first etched insulating material coating.

2. A process according to claim 1, wherein a silicon oxide coating is formed on the substrate surface, followed by a silicon nitride coating on the first coating.

3. A process according to claim 2, wherein the silicon oxide coating is formed by thermal oxidation of the substrate.

4. A process according to claim 2, wherein the silicon nitride coating is formed by deposition.

5. A process according to claim 1, wherein the second insulating material coating is formed from silicon oxide.

6. A process according to claim 1, wherein the second insulating material coating is formed by deposition.

7. A process according to claim 1, wherein, between stages (b) and (c), is formed a resin mask on the second insulating material coating and which is used for defining the location of the trench.

8. A process according to claim 7, wherein the resin mask has an opening having a greater width than that of the trench to be formed.

9. A process according to claim 7, wherein the resin mask is eliminated between stages (c) and (d).

10. A process according to claim 1, wherein insulating spacers are formed by depositing a third insulating coating on the second etched insulating material coating and then by anisotropically etching said third coating.

11. A process according to claim 1, wherein the spacers are made from silicon oxide.

12. A process according to claim 1, wherein the insulating edges of the trench are formed by thermal oxidation of the etched substrate.

13. A process according to claim 1, wherein the trench is filled by isotropic deposition.

14. A process according to claim 13, wherein the excess polycrystalline silicon inside the trench is eliminated, so as to obtain a planar surface.

15. A process according to claim 1, wherein, between stages (d) and (e), there is a slight isotropic etching of the exposed substrate region, the second etched insulating material coating and the spacers used as a mask for said etching.

16. A process according to claim 7, wherein spacers are formed in the etched flanks of the first and second insulating material coatings, as well as on the etched flanks of the exposed substrate region.

17. A process according to claim 7, wherein, between stages (c) and (d), there is a slight anisotropic etching of the exposed substrate region through the resin mask.

* * * * *